(12) United States Patent
Lee et al.

(10) Patent No.: US 7,378,685 B2
(45) Date of Patent: May 27, 2008

(54) FLAT DISPLAY DEVICE

(75) Inventors: Sun-Youl Lee, Suwon-si (KR); Kyong-Do Kim, Suwon-si (KR)

(73) Assignee: Samsung SDI Co., Ltd., Suwon (KR)

( * ) Notice: Subject to any disclaimer, the term of this patent is extended or adjusted under 35 U.S.C. 154(b) by 85 days.

(21) Appl. No.: 11/086,738

(22) Filed: Mar. 23, 2005

(65) Prior Publication Data

US 2005/0211990 A1    Sep. 29, 2005

(30) Foreign Application Priority Data

Mar. 29, 2004   (KR) .................. 10-2004-0021150

(51) Int. Cl.
  *H01L 27/15* (2006.01)
(52) U.S. Cl. .................. 257/79; 257/72; 257/678
(58) Field of Classification Search .......... 257/72, 257/79, 678
  See application file for complete search history.

(56) References Cited

U.S. PATENT DOCUMENTS

| 5,517,208 A | 5/1996 | Mori et al. ............ 345/87 |
|---|---|---|
| 5,572,346 A | 11/1996 | Sakamoto et al. ............ 359/88 |
| 6,319,019 B1 | 11/2001 | Kwon et al. ............ 439/67 |
| 2002/0027634 A1 | 3/2002 | Kang et al. ............ 349/150 |
| 2004/0179165 A1* | 9/2004 | Kinoshita et al. ............ 349/158 |

FOREIGN PATENT DOCUMENTS

| DE | 41 15 160 | 11/1991 |
|---|---|---|
| JP | 59-17810 | 1/1984 |
| JP | 1-251079 | 10/1989 |
| JP | 11-249113 | 9/1999 |
| JP | 2000-268735 | 9/2000 |
| JP | 2000-298264 | 10/2000 |
| JP | 2003-114446 | 4/2003 |
| JP | 2003140564 | 5/2003 |
| KR | 10-2001-0055670 | 7/2001 |
| KR | 10-2002-0009330 | 2/2002 |
| WO | WO 01/79920 | 10/2001 |

* cited by examiner

*Primary Examiner*—Long Pham
(74) *Attorney, Agent, or Firm*—H.C. Park & Associates, PLC

(57) ABSTRACT

A flat display device including a display region disposed between a substrate and a sealing substrate that are coupled together by a sealing member, an electrical element that is electrically coupled with the display region, and at least one reinforcing member that increases the strength of a region where it is located. The reinforcing member is mounted at at least one side of the electrical element.

19 Claims, 9 Drawing Sheets

FLAT DISPLAY DEVICE

CROSS REFERENCE TO RELATED APPLICATION

This application claims priority to and the benefit of Korean Patent Application No. 10-2004-0021150, filed on Mar. 29, 2004, which is hereby incorporated by reference for all purposes as if fully set forth herein.

BACKGROUND OF THE INVENTION

1. Field of the Invention

The present invention relates to a flat display device, and more particularly, to a flat display device with an electrical element that may not separate from a substrate when the substrate bends or twists.

2. Discussion of the Background

Numerous types of flat display devices are used to display images, and they are often chosen to replace conventional cathode ray tubes (CRTs). A flat display device may be an emissive or non-emissive type according to its light emission structure. The emissive type includes a flat CRT, a plasma display panel device, a vacuum fluorescent display device, a field emission display device, and an organic light emitting display device, and the non-emissive type includes a liquid crystal display device.

Flat display device technology is advancing rapidly. Among the developments, the display device's display region has been formed on a flexible film, so that the device is simple to mount and carry.

Japanese Patent Laid-Open Publication 2000-268735 and Japanese Patent Laid-Open Publication 2003-114446 disclose various ways to mount driver ICs for flat display devices.

However, when a twisting or bending moment is applied to the flexible film, electrical elements, such as a driver, may separate from the substrate since an anisotropic conductive film interposed between the substrate and the driver may not withstand the twisting or bending. Japanese Patent Laid-Open Publication 1999-249113 discloses an LCD structure for preventing disconnection of a TCP due to external impact or vibration.

Korean Patent Publication No. 2001-55670 and Korean Patent Publication No. 2002-9330 disclose a method of mounting driving chips on LCD panels and an LCD module with anti-deformation means such as a slit for absorbing impacts.

However, these conventional techniques may not prevent electronic components, such as the driving chip, from separating from the substrate when a twisting or bending moment is applied to the substrate or panel, and particularly to a flexible film.

SUMMARY OF THE INVENTION

The present invention provides a flat display device that may prevent an electrical element from separating from a substrate that twists or bends.

Additional features of the invention will be set forth in the description which follows, and in part will be apparent from the description, or may be learned by practice of the invention.

The present invention discloses a flat display device comprising a display region disposed between a substrate and a sealing substrate that are coupled by a sealing member, an electrical element that is electrically coupled with the display region, and at least one reinforcing member being mounted at at least one side of the electrical element.

The present invention also discloses a flat display device, comprising a substrate, a thin film sealing layer, a display region between the substrate and the thin film sealing layer, an electrical element electrically coupled with the display region, and a reinforcing member mounted at a side of the electrical element.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

The present invention will now be described more fully with reference to the accompanying drawings showing exemplary embodiments of the invention.

Figure 1:
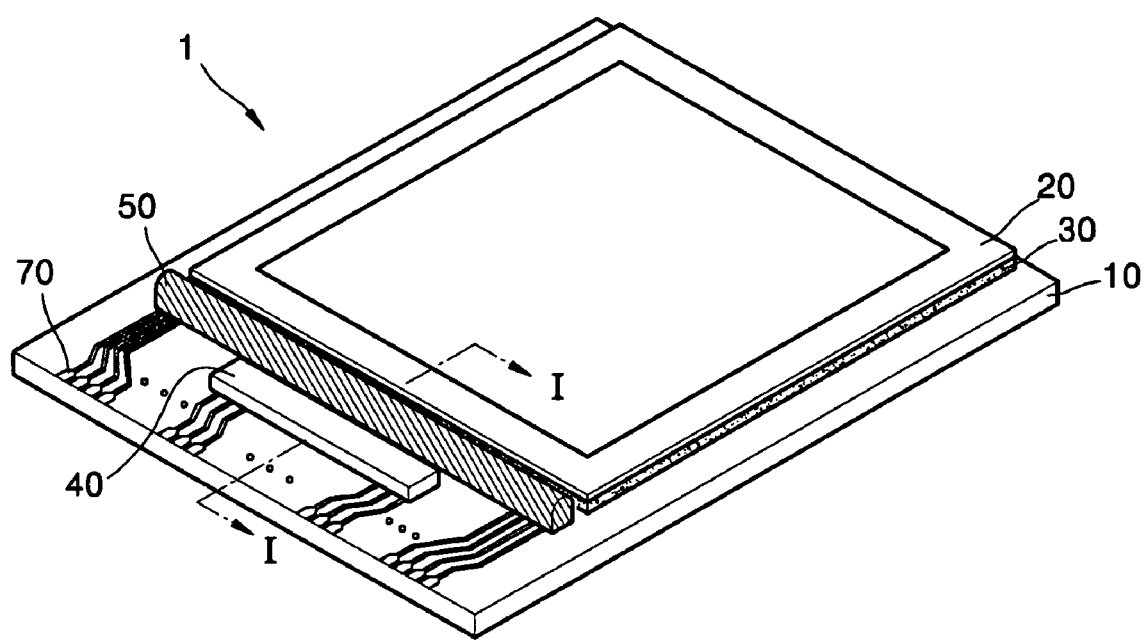
FIG. 1 is a perspective view showing a flat display device according to an exemplary embodiment of the present invention.
Figure 2A:
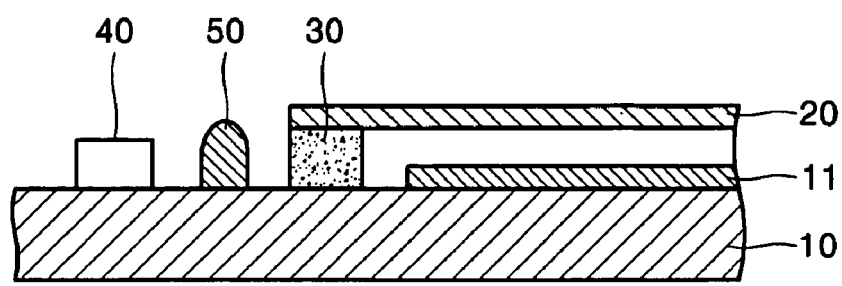
FIG. 2A is a cross-sectional view taken along line I-I of FIG. 1.

FIG. 1 is a perspective view showing a flat display device 1 according to an exemplary embodiment of the present invention, and FIG. 2A is a cross-sectional view taken along line I-I of FIG. 1. For clarity, wiring is not shown in FIG. 2A.

Referring to FIG. 1 and FIG. 2A, a display region 11, which may include several stacked layers, may be formed on a surface of a substrate 10. The substrate 10 can be flexible. The display region 11 may be enclosed within the substrate 10 and a sealing substrate 20, which may be sealed together by a sealing member 30. The substrate 10 may be formed of a variety of materials including glass or a plastic such as polyethylene terephthalate (PET), polyethylene naphthalate (PEN), polyimide, or other like materials.

An electrical element 40, such as a horizontal driving circuit unit that supplies data signals to the display region's pixels, may be disposed on a surface of the substrate 10. Also, terminal units 70, for receiving and transmitting electrical signals between the electrical element 40 and the display region 11, may be disposed on a surface of the substrate 10.

The device may include at least one reinforcing member 50 that is arranged apart from the electrical element 40.

As FIG. 1 and FIG. 2A show, the reinforcing member 50 may be interposed between the display region 11 and the electrical element 40.

The region where the reinforcing member 50 is disposed may be stiffer than a surrounding region. In some cases, the reinforcing member 50 may be stiffer than the substrate 10. The reinforcing member 50 may be bar-shaped, or for manufacturing convenience, it may be adhesive tape. However, the form and stiffness of the reinforcing member 50 is not limited to these examples.

Figure 2B:
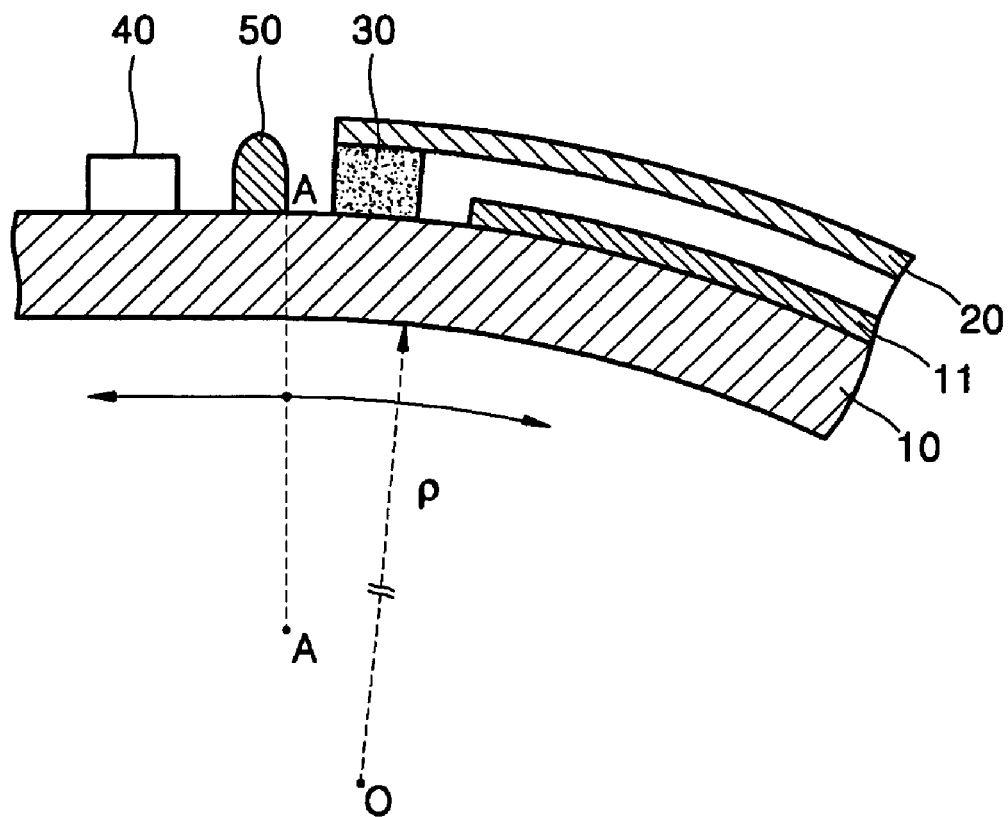
FIG. 2B is a cross-sectional view taken along line I-I of FIG. 1 when a bending moment is applied.

FIG. 2B is a cross-sectional view taken along line I-I of FIG. 1 when a twisting or bending moment is applied to an end of the display region 11 while the opposite end of the substrate 10 is fixed. Referring to FIG. 2B, the right side of a dotted line AA (i.e. the side of the substrate 10 on which the display region 11 is formed) may have a radius of curvature ρ (ρ>1) from a center of the curvature. However, the other side of the substrate 10, (i.e. left of the dotted line AA and toward the electrical element 40) may almost have an infinite radius of curvature ρ. In other words, the reinforcing member 50 may prevent the bending moment applied to the display region 11 from transferring to the portion of the substrate where the electrical element 40 is formed.

Figure 3A:
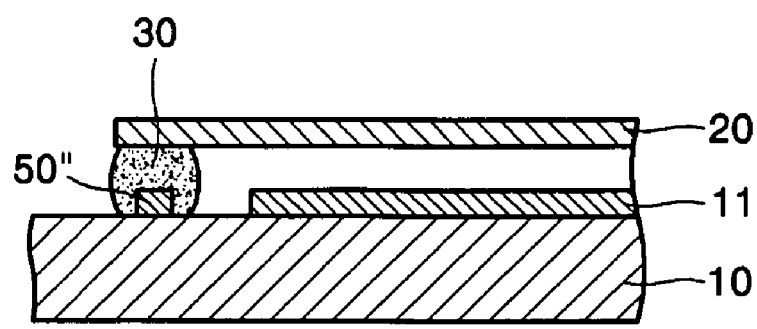
FIG. 3A and FIG. 3B are cross-sectional views showing a flat display device according to an exemplary embodiment of the present invention.

The reinforcing member 50 may have a variety of arrangements. For example, referring to FIG. 3A, a reinforcing member 50" may be disposed within the sealing member 30, which is interposed between the display region 11 and the electrical element (not shown). That is, the sealing member 30 may surround the reinforcing member 50".

Figure 3B:
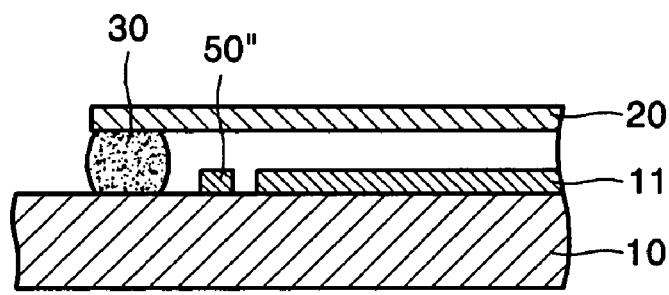

Also, referring to FIG. 3B, the reinforcing member 50"' may be disposed between the electrical element and the display region 11 and in a region enclosed by the substrate 10, the sealing substrate 20, and the sealing member 30. An additional region for mounting the reinforcing member 50 is not necessary with this structure.

Figure 4A:
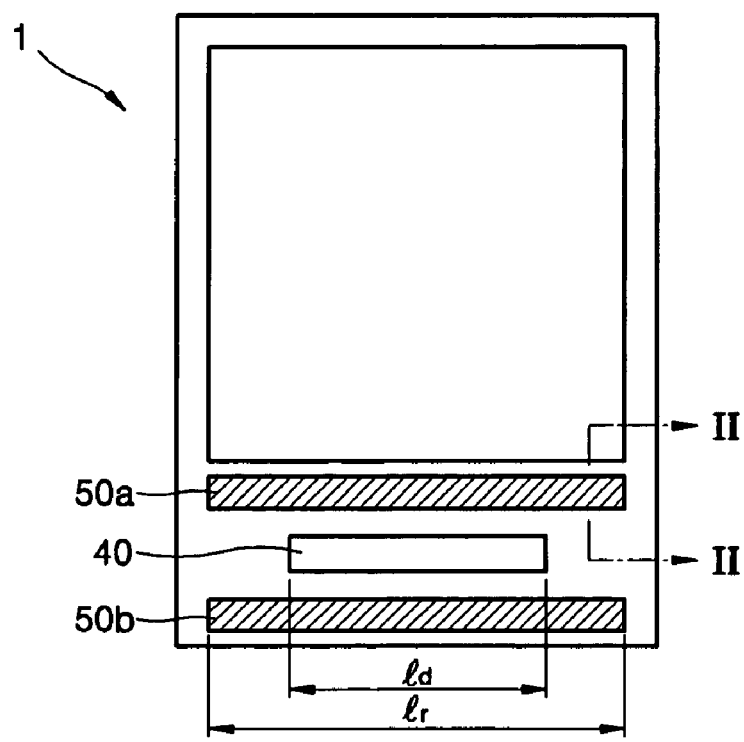
FIG. 4A and FIG. 4B are plan views showing a flat display device according to an exemplary embodiment of the present invention.

The flat display device according to the present invention may include more than one reinforcing member 50 for protecting the electrical element. For example, referring to FIG. 4A, two reinforcing members 50a and 50b may be disposed one on either side of the electrical element 40. A cross-sectional view taken along line II-II in FIG. 4A may look similar to FIG. 2A.

Here, a length $l_d$ of the electrical element 40 may be less than a length $l_r$ of the reinforcing members 50a and 50b, to prevent a twisting or bending moment from transmitting from the display region 1 to the electrical element 40 along the substrate 10.

Figure 4B:
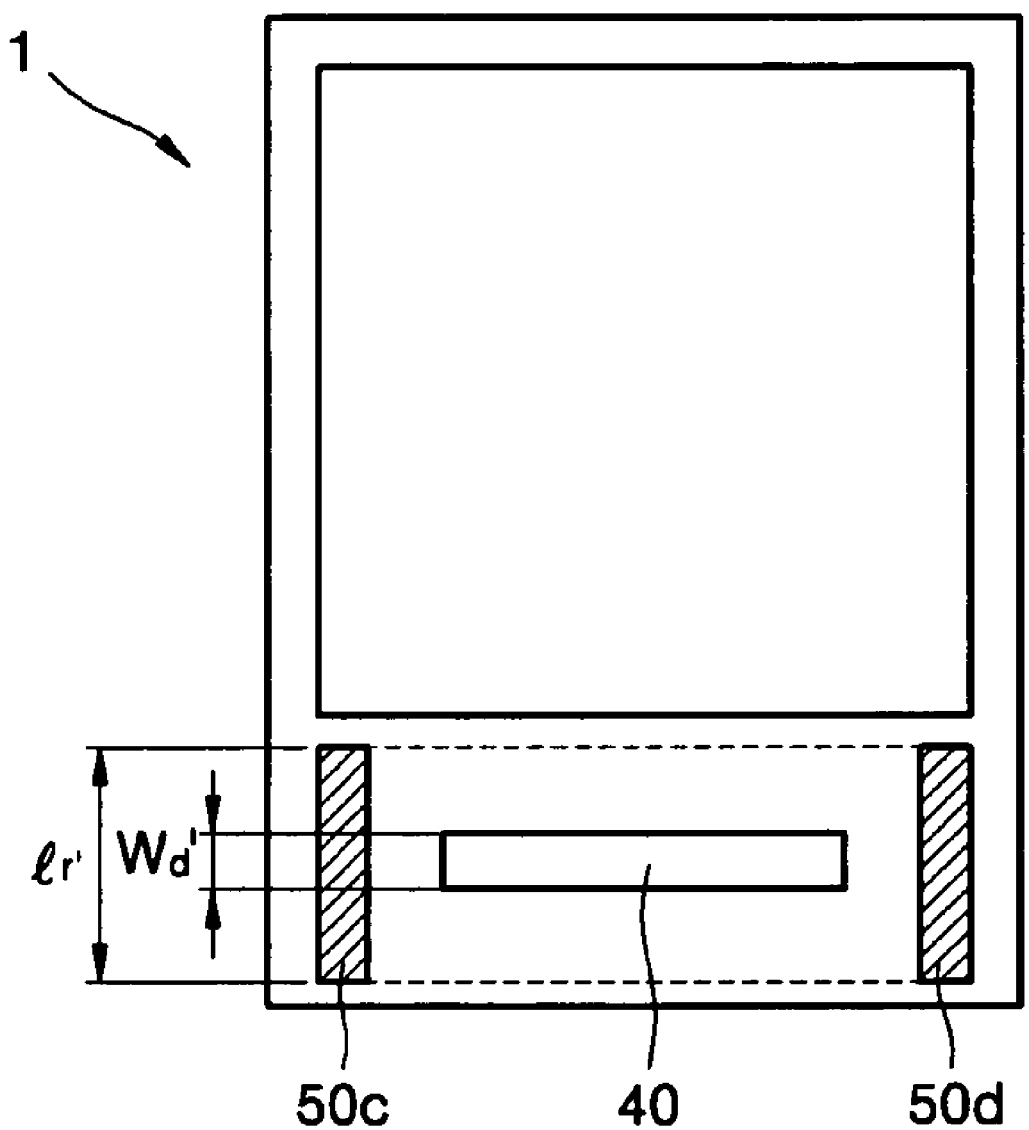

Also the reinforcing member 50 may be orthogonally arranged to the electrical element 40. FIG. 4B shows an exemplary embodiment where reinforcing members 50c and 50d, arranged in parallel to each other, are disposed orthogonally to the electrical element 40.

Referring to FIG. 4B, a length $l_r$ of the reinforcing members 50c and 50d may be greater than a width $W_d'$ of the electrical element 40, so that the electrical element 40 may be disposed within a region, indicated by the dotted lines, where transmission of the twisting or bending moment may be blocked.

Figure 5A:
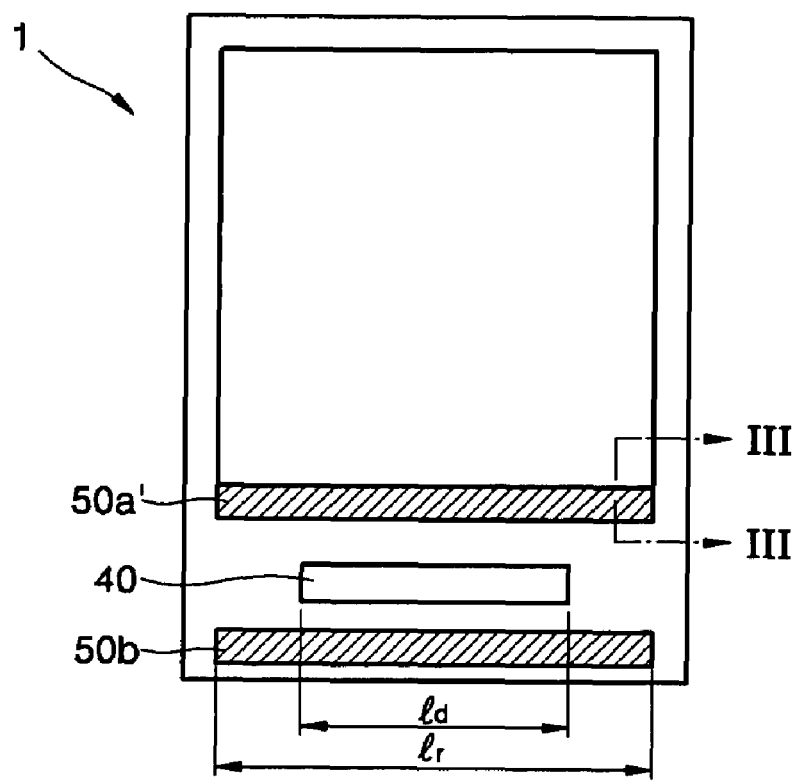
FIG. 5A is a plan view showing a flat display device according to an exemplary embodiment of the present invention.
Figure 5B:
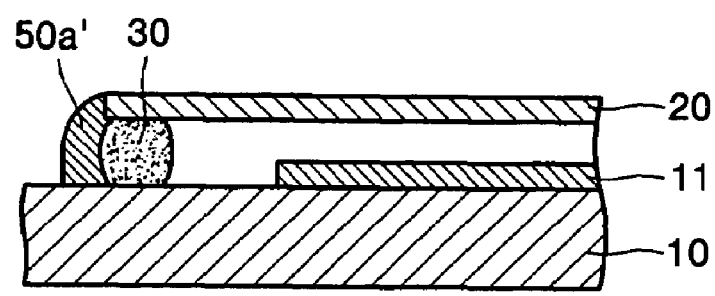
FIG. 5B is a cross-sectional view taken along line III-III of FIG. 5A.

Meanwhile, the reinforcing member 50 may contact at least one side of at least one of the sealing substrate 20 and the sealing member 30. Referring to FIG. 5A and FIG. 5B, which is a cross-sectional view taken along line III-III of FIG. 5A, a reinforcing member 50a' may contact a side of the sealing member 30 and the sealing substrate 20. This structure may help prevent weakening of adhesion between the sealing substrate 20 and the substrate 10 when a twisting or bending moment is applied to the substrate 10.

Figure 6A:
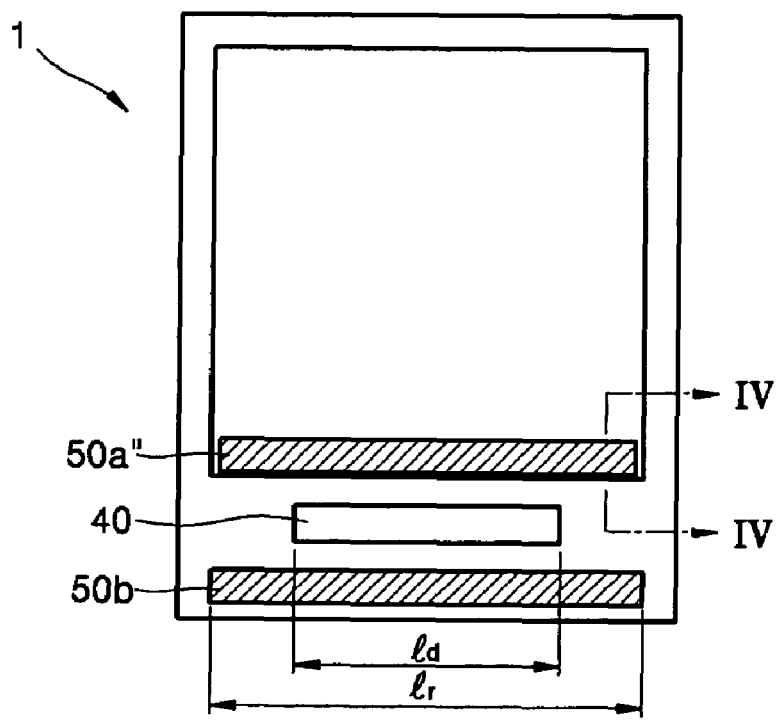
FIG. 6A is a plan view showing a flat display device according to an exemplary embodiment of the present invention.
Figure 6B:
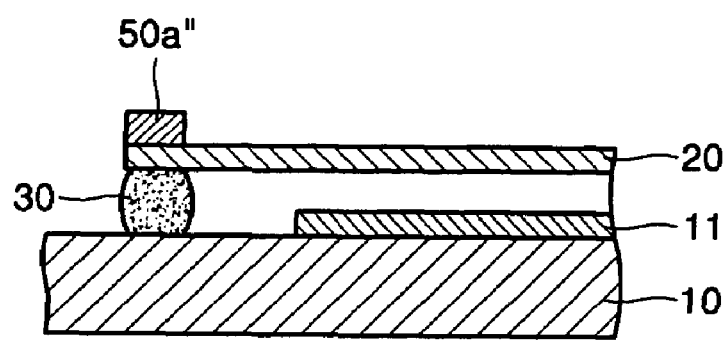
FIG. 6B is a cross-sectional view taken along line IV-IV of FIG. 6A.

Alternatively, referring to FIG. 6A and FIG. 6B, which is a cross-sectional view taken along line IV-IV of FIG. 6A, a reinforcing member 50a" may be disposed between the display region 11 and the electrical element 40, on a surface of the sealing substrate 20 that is opposite to the substrate 10, and in a region where the sealing member 30 is disposed.

Figure 7A:
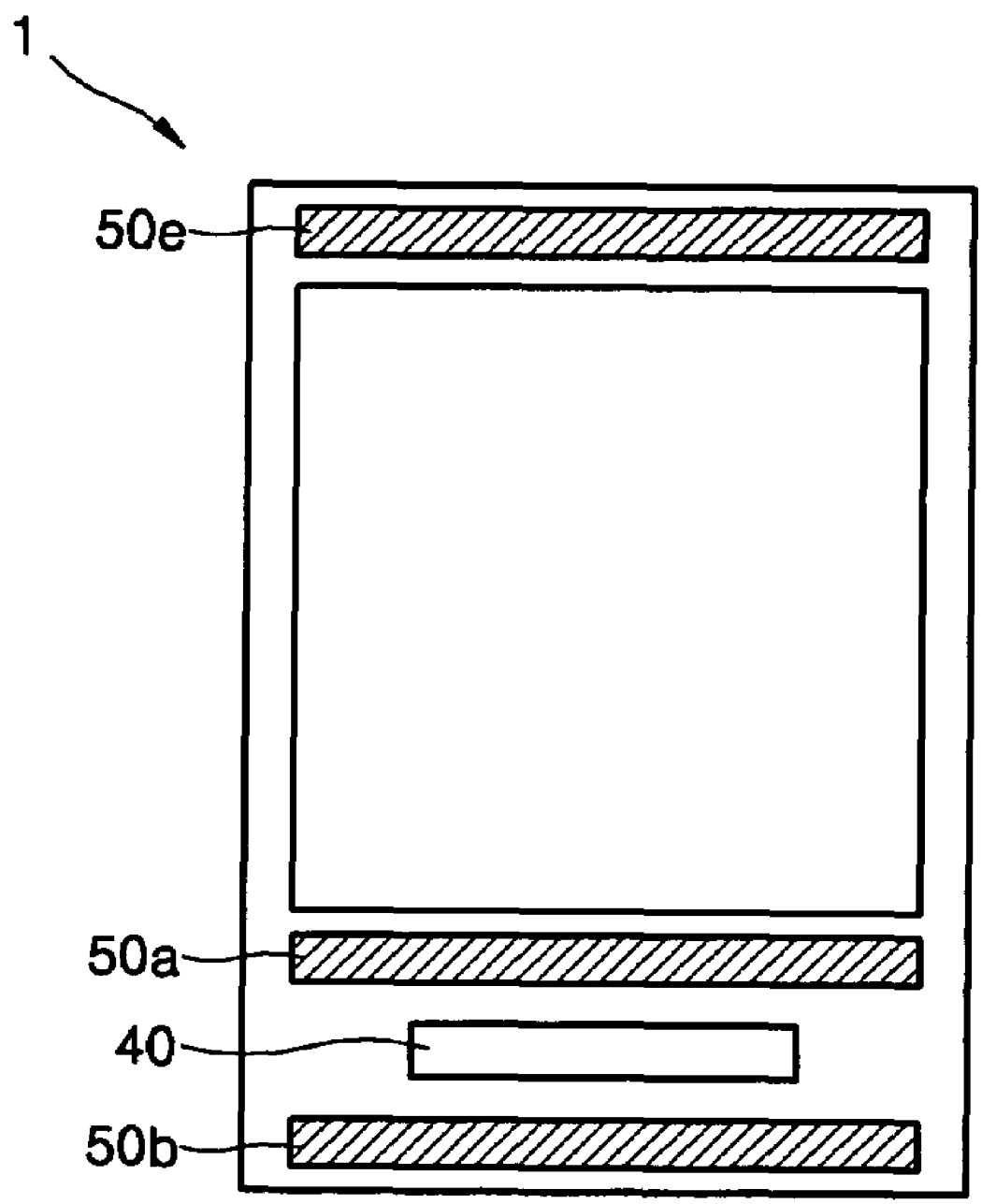
FIG. 7A is a plan view showing a flat display device according to an exemplary embodiment of the present invention.
Figure 7B:
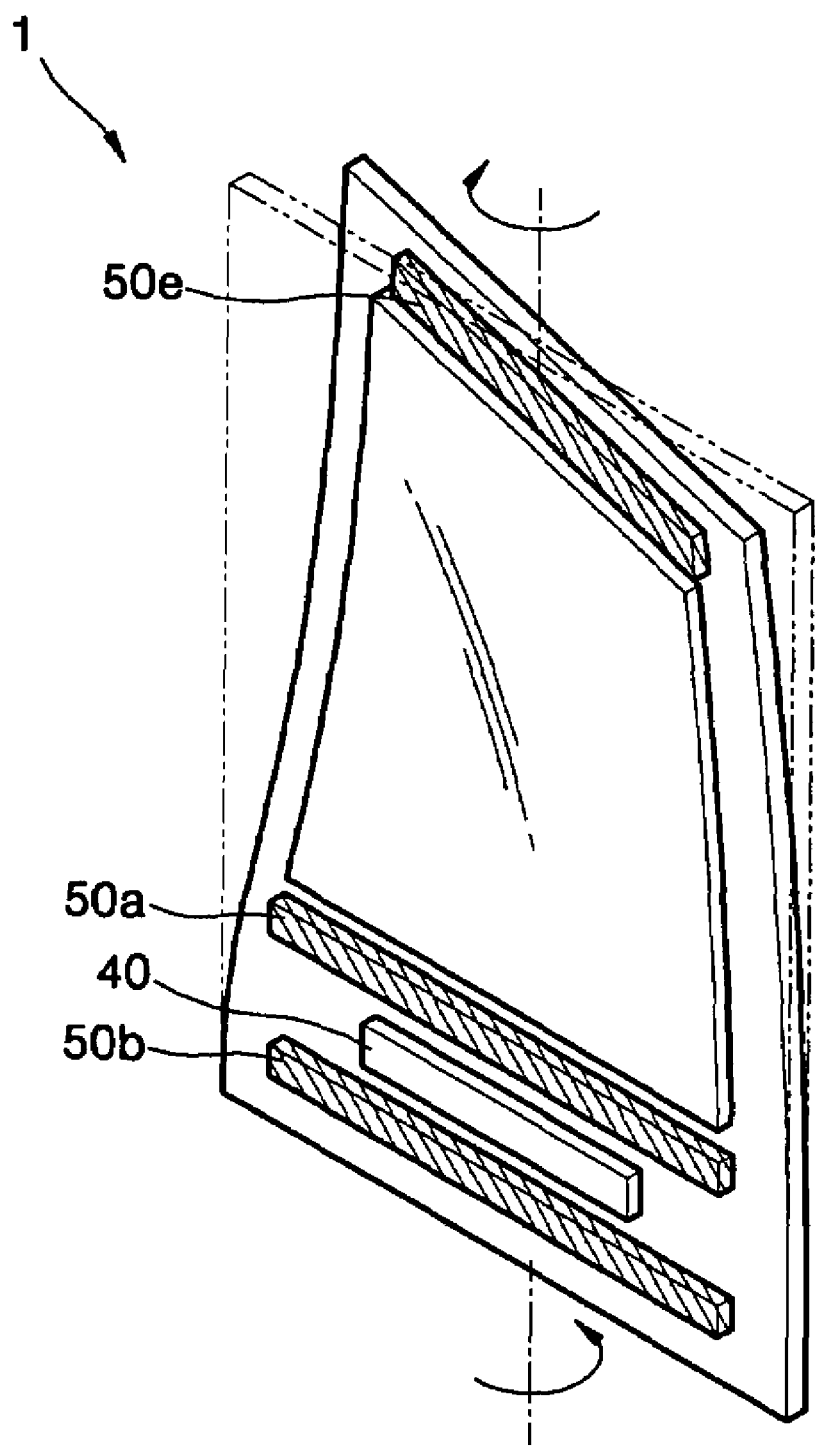
FIG. 7B is a perspective view showing a flat display device with a twisting moment applied to both ends of the device.

Referring to FIG. 7A, the display region 11 may be disposed between at least two reinforcing members 50a and 50e. In this case, referring to FIG. 7B, when a twisting moment is applied to the substrate 10, the uppermost reinforcing member 50e and the reinforcing member 50a may prevent significant twisting or bending of the substrate 10 from transmitting to the electrical element 40.

Figure 8:
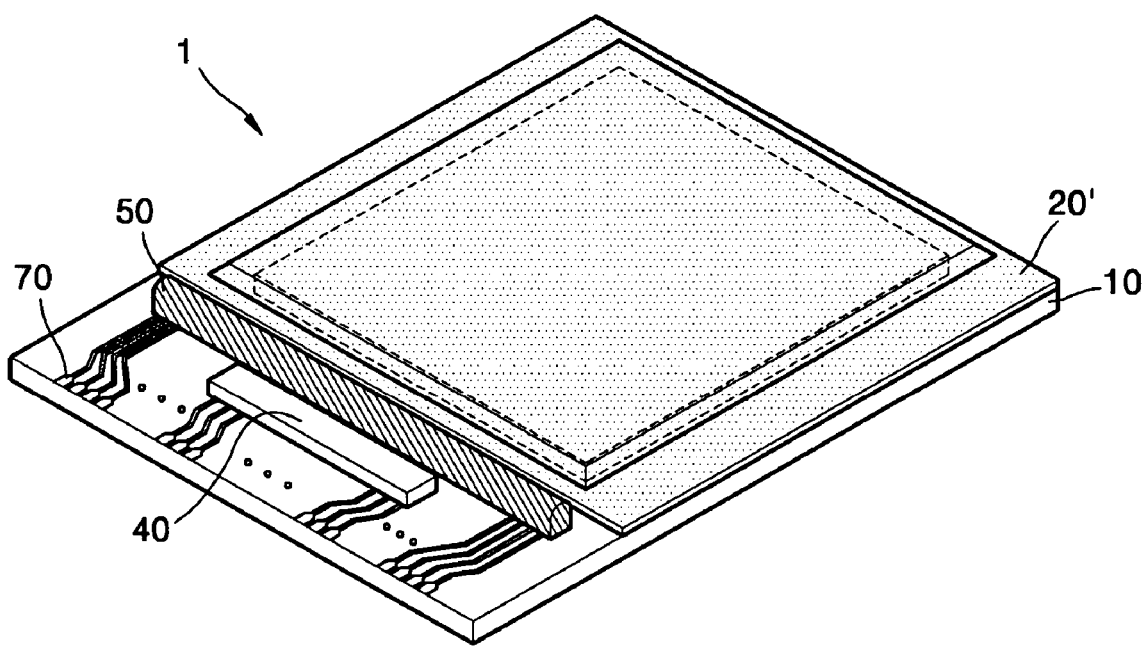
FIG. 8 is a perspective view showing a flat display device according to an exemplary embodiment of the present invention.

The above exemplary embodiments of the present invention are described with regard to a flat display device including a sealing substrate 20, however the present invention is not limited thereto. As FIG. 8 shows, the present invention may also be applied to a device where a thin film sealing layer 20' seals the display region. Here, even though a sealing substrate is not utilized, the details of the above-described embodiments may be equally applied.

While the display region 11 is described above as having stacked layers, the present invention is not limited thereto. That is, the display region 11 may include a variety of display devices, such as organic and/or inorganic light emitting devices, liquid crystal display devices, plasma display panels, or field emission devices and is not limited to a particular type of display device. Accordingly, the present invention may be applied to various types of flat display devices that are capable of including a reinforcing member.

A reinforcing member according to the present invention may prevent electrical elements, such as a driving unit, from separating from a substrate to which they are attached by blocking or decreasing a twisting or bending moment applied to a display region. There are no restrictions on the number or configuration of reinforcing members, provided they adequately block transmission of a twisting or bending moment to the electrical element.

A reinforcing member disposed between a sealing member and the display region may prevent an electrical element from separating from the substrate due to a twisting or bending moment. Further, in this case, additional space for mounting the reinforcing member may not be necessary.

Also, placing the reinforcing member in contact with the sealing member and/or the sealing substrate may prevent the sealing member from separating from the substrate or the sealing substrate in response to a twisting or bending moment applied to the substrate.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A flat display device, comprising:
   a substrate;
   a sealing substrate;
   a sealing member coupling the substrate with the sealing substrate;
   a display region between the substrate and the sealing substrate;
   an electrical element electrically coupled with the display region; and
   at least one reinforcing member being mounted at at least one side of the electrical element so as to prevent the electrical element from separating from the substrate when the substrate is bent or twisted,
   wherein the reinforcing member is spaced apart from the electrical element and is stiffer than the substrate.

2. The flat display device of claim 1, wherein the reinforcing member is disposed between the electrical element and the display region.

3. The flat display device of claim 1, wherein the reinforcing member is disposed between the electrical element and the sealing member.

4. The flat display device of claim 1, wherein the sealing member covers the reinforcing member.

5. The flat display device of claim 1, wherein the reinforcing member is disposed between the sealing member and the display region.

6. The flat display device of claim 2, wherein at least two reinforcing members are included and the electrical element is disposed between one reinforcing member and the other reinforcing member.

7. The flat display device of claim 3, wherein at least two reinforcing members are included and the electrical element is disposed between one reinforcing member and the other reinforcing member.

8. The flat display device of claim 4, wherein at least two reinforcing members are included and the electrical element is disposed between one reinforcing member and the other reinforcing member.

9. The flat display device of claim 5, wherein at least two reinforcing members are included and the electrical element is disposed between one reinforcing member and the other reinforcing member.

10. The flat display device of claim 1, wherein the reinforcing member is longer than the electrical element.

11. The flat display device of claim 1, wherein the reinforcing member is orthogonal to the electrical element.

12. The flat display device of claim 11, further comprising:
    another reinforcing member arranged in parallel with the reinforcing member,
    wherein the electrical element is disposed between one reinforcing member and the other reinforcing member.

13. The flat display device of claim 11, wherein a length of the reinforcing member is greater than a width of the electrical element.

14. The flat display device of claim 1, wherein at least two reinforcing members are included and the display region is disposed between one reinforcing member and the other reinforcing member.

15. The flat display device of claim 1, wherein the reinforcing member contacts at least one of the sealing substrate and the sealing member.

16. The flat display device of claim 1, wherein the display region includes an organic light emitting diode.

17. The flat display device of claim 1, wherein the substrate is flexible.

18. The flat display device of claim 1, wherein the reinforcing member is an adhesive tape.

19. A flat display device, comprising:
    a substrate;
    a thin film sealing layer;
    a display region between the substrate and the thin film sealing layer;
    an electrical element electrically coupled with the display region; and
    a reinforcing member mounted at a side of the electrical element so as to prevent the electrical element from separating from the substrate when the substrate is bent or twisted,
    wherein the reinforcing member is spaced apart from the electrical element and is stiffer than the substrate.

* * * * *